United States Patent [19]

Takenaka

[11] Patent Number: 5,866,926
[45] Date of Patent: Feb. 2, 1999

[54] FERROELECTRIC MEMORY DEVICE WITH CAPACITOR ELECTRODE IN DIRECT CONTACT WITH SOURCE REGION

[75] Inventor: Kazuhiro Takenaka, Suwa, Japan

[73] Assignee: Ramtron International Corporation, Colorado Springs, Colo.

[21] Appl. No.: 93,790

[22] Filed: Jul. 19, 1993

Related U.S. Application Data

[63] Continuation of Ser. No. 853,691, filed as PCT/JP91/01281 Sep. 26, 1991, abandoned.

[30] Foreign Application Priority Data

Sep. 28, 1990 [JP] Japan ................... P2-259456

[51] Int. Cl.⁶ .................. H01L 27/108; H01L 29/78
[52] U.S. Cl. .................. 257/295; 257/310; 257/751
[58] Field of Search .................. 257/295, 310, 257/751

[56] References Cited

U.S. PATENT DOCUMENTS

| | | | |
|---|---|---|---|
| 4,141,022 | 2/1979 | Sigg et al. ................... | 257/751 |
| 4,851,895 | 7/1989 | Green et al. ................... | 257/751 |
| 5,043,049 | 8/1991 | Takenaka ................... | 250/492.1 |
| 5,046,043 | 9/1991 | Miller et al. ................... | 257/310 |
| 5,099,305 | 3/1992 | Takenaka ................... | 257/310 |

FOREIGN PATENT DOCUMENTS

A 380 326  8/1990  European Pat. Off. ......... H01G 7/06

OTHER PUBLICATIONS

"Structure For Improving The Electrical Characteristics of Polysilicon Contacted n–p Junction", *IBM Technical Disclosure Bulletin*, vol. 31, No. 9, pp. 249–251 (Feb., 1989).

*Primary Examiner*—Jerome Jackson, Jr.
*Attorney, Agent, or Firm*—Edward D. Manzo; Mark J. Murphy; Peter J. Meza

[57] ABSTRACT

A memory suitable for integration having a memory structure where at least one capacitor formed by using a ferroelectric is integrated on a semiconductor device substrate. In a unit cell structure forming the memory, an upper electrode, located at an upper position among electrodes constituting the capacitor, is directly connected to a high density diffusion layer constituting a MOS transistor.

7 Claims, 3 Drawing Sheets

FERROELECTRIC MEMORY DEVICE WITH CAPACITOR ELECTRODE IN DIRECT CONTACT WITH SOURCE REGION

This is a continuation of application Ser. No. 07/853,691, filed as PCT/JP91/01281 Sep. 26, 1991, now abandoned.

FIELD OF THE INVENTION

The present invention relates to a memory structure using a ferroelectric material, and more particularly, to a nonvolatile memory capable of electric re-writing.

BACKGROUND OF THE INVENTION

MIS transistors are usually used for conventional semiconductor nonvolatile memories. These memories use a phenomenon where the surface potential of a silicon substrate can be modified through an injection of charge from the silicon substrate into an insulating gate trap or a floating gate. Examples of these memories are an EPROM (ultraviolet ray erasing type nonvolatile memory) and an EEPROM (electrically rewritable nonvolatile memory).

These nonvolatile memories, however, have disadvantages in that the information re-writing voltage is usually high (about 20 V), and the re-writing time is extremely long (several tens of msec. for the EEPROM). In addition, the information re-writing number is very small, typically about 10,000, thus posing problems for repeated use.

With a nonvolatile memory using a ferroelectric material capable of an electrically inverting polarization, the writing-in and reading-out times are substantially the same in principle, and the polarization is maintained even if the power source is disconnected. Thus, the memory can possibly be an ideal nonvolatile memory. Proposals for such a nonvolatile memory using a ferroelectric material include structures having a ferroelectric capacitor integrated on a silicon substrate as shown in U.S. Pat. No. 4,149,302, and a ferroelectric film provided on a gate portion of a MIS transistor as shown in U.S. Pat. No. 3,832,700.

Further, a nonvolatile memory having a laminate structure of a MOS semiconductor device as shown in FIG. 3 has been recently proposed in the IEDM, '87 pp, 850–851. In FIG. 3, reference numeral 301 designates a P-type Si substrate, 302 designates a LOCOS oxide film for isolation, 303 designates an N-type diffusion layer constituting a source, 304 designates an N-type diffusion layer constituting a drain, 305 designates a gate electrode, and 306 designates an interlayer insulation film. Designated by reference numeral 309 is a ferroelectric film which forms a capacitor with upper and lower electrodes 310 and 311 having the ferroelectric film therebetween. Reference numeral 307 illustrates a second interlayer insulation film and 312 designates an Al lead, wiring or interconnection electrode which connects the upper electrode 310 to the source diffusion layer 303.

In such a ferroelectric memory structure, the upper electrode 310 is formed by using Pt and the like in view of its contact with the ferroelectric film 309. The wiring or interconnection is carried out by using the wiring electrode 312. With such a structure, the cell area is increased, and a high density integration is not attained. The present invention seeks to solve this problem, and its objective is to provide a ferroelectric memory which has a reduced memory cell area and is suitable for integration.

SUMMARY OF THE INVENTION

The present invention is directed to a memory structure with at least one ferroelectric capacitor integrated on a substrate of semiconductor device. In particular, the present invention is directed to a structure of a unit cell forming a part of a memory, wherein a memory suitable for integration can be obtained by connecting an upper electrode, which is located in an upper position and forms one of the capacitor electrodes, directly to a high density diffusion layer of a MOS transistor.

DETAILED DESCRIPTION OF THE PRESENTLY PREFERRED EMBODIMENTS

Figure 1:
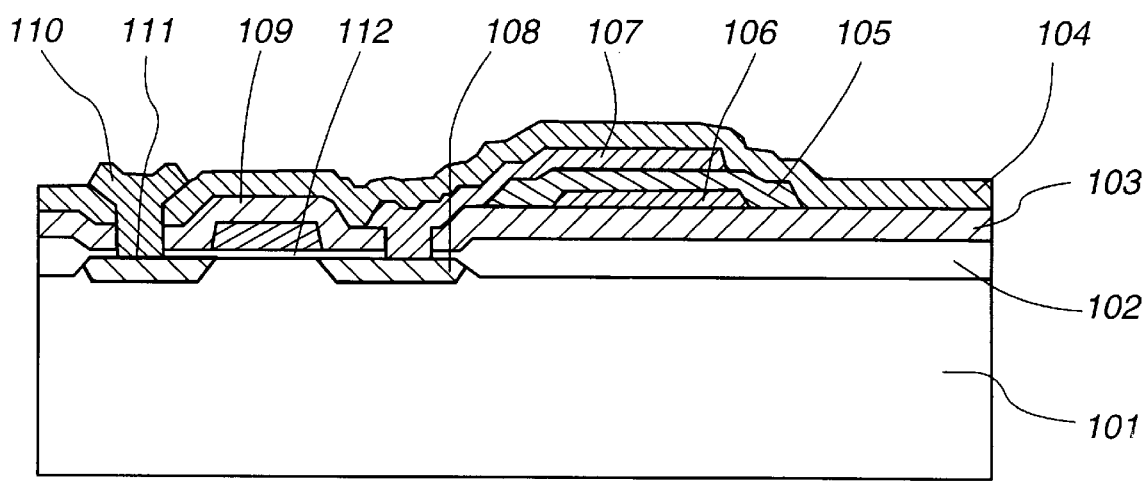
FIG. 1 is a sectional view showing a first embodiment of the present invention.

FIG. 1 is a sectional view showing a preferred embodiment of the semiconductor device according to the present invention. The present invention will be described with reference to FIG. 1. In the description of FIG. 1, a Si substrate and an N-channel transistor are used as an example. A P-channel transistor could be used in a similar manner.

Reference numeral 101 illustrates a P-type Si substrate formed by using, for example, a wafer with a specific resistance of 20 Ohm.cm. Reference numeral 102 indicates a $SiO_2$ film for isolation, which is formed to a thickness of 6000 Å by using a conventional LOCOS technique. Reference numeral 109 indicates, for example, poly-Si intended to form a gate electrode which is grown to a thickness of 5,000 Å using a vapor phase epitaxy, that is a chemical vapor deposition method. Reference numeral 112 indicates $SiO_2$ gate insulation film formed to a thickness of 300 Å. Reference numeral 103 indicates an interlayer insulation film for separating the gate electrode 109 and a ferroelectric film 105. The interlayer insulation film is formed of, for example, $SiO_2$ with a thickness of 4000 Å.

Reference numeral 106 indicates a lower electrode of a ferroelectric capacitor. The electrode is formed, for example, of Pt with a thickness of 2000 Å. Reference numeral 105 illustrates the ferroelectric film which is formed of, for example, PZT with a thickness of 6000 Å by using a sputtering method. Reference numeral 108 indicates an N-type diffusion layer intended to form a source of a MOS transistor which is formed by using, for example, an ion injection of phosphorus to a concentration of $5 \times 10^{15}/cm^2$. Reference numeral 111 indicates an N-type diffusion layer intended to form a drain of the MOS transistor which is connected with an interconnecting or wiring electrode 110, made of, for example, Al.

Reference numeral 107 designates an upper electrode formed by sputtering Pt to a thickness of 2000 Å. The upper electrode 107 also plays the role of connection wiring between the upper electrode 107 and the source diffusion layer 108. Reference numeral 104 indicates an interlayer insulation film for isolating the ferroelectric capacitor and the wiring electrode 110 of Al. The interlayer insulation film 104 is formed by, for example, growing $SiO_2$ to a thickness of 5000 Å. The structure of this invention can be obtained by the above-mentioned process.

The operation according to this invention is described below. Since electrode 107 operates as the upper electrode of the ferroelectric film, a metal having a high melting point such as Pt and the like is required. The ferroelectric capacitor is located close to the source diffusion layer 108, so that it is possible to connect the upper electrode 107 of the ferroelectric capacitor to the source diffusion layer 108 by using the upper electrode 107 as it is. Thus, the area of an element may be made smaller and, therefore, a memory suitable for integration is obtainable. Further, the wiring electrode 110 can be formed in the upper part of 107 (not shown), so that the freedom of wiring is increased.

Figure 2:
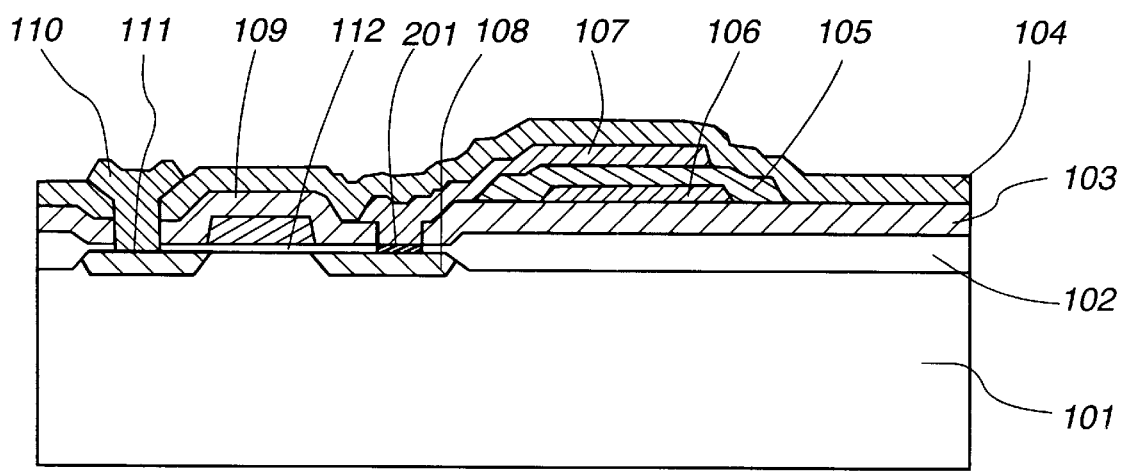
FIG. 2 is a sectional view showing another embodiment of the present invention.
Figure 3:
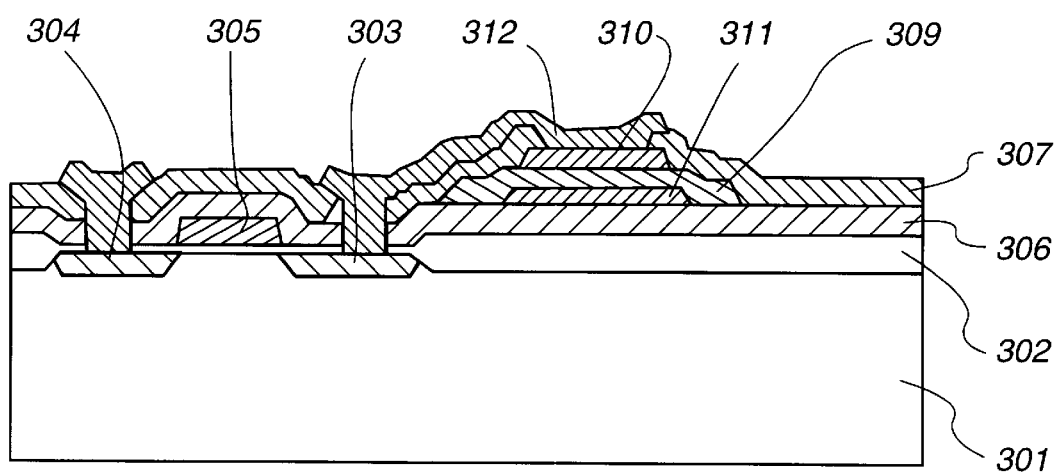
FIG. 3 is a sectional view showing a conventional semiconductor memory using a ferroelectric material.

FIG. 2 is a sectional view showing another embodiment of this invention. In FIG. 2, a barrier metal 201 is made of, for example, TiN and is located between the upper electrode 107 and the source diffusion layer 108. Usually, a metal having such a high melting point such as Pt and the like has a strong reaction with respect to Si. The reaction of the metal occurs during a thermal treatment after the formation of the upper electrode 107, which sometimes causes a short circuit between the source diffusion layer 108 and the P-type substrate 101. In order to prevent this reaction, a barrier metal 201 is provided in the structure shown in FIG. 2. The barrier metal 201 may be TiN formed by using a sputtering method, or TiON, MoSi, TiW, $RuO_2$, $ReO_2$ and so forth. After forming these barrier metals over the entire wafer surface by using a sputtering method, for example, the steps of coating a resist and then etching back are carried out, thus obtaining the structure shown in FIG. 2.

As described above, according to this invention, a memory suitable for integration is obtained by taking a memory structure where at least one capacitor with a ferroelectric material is integrated on the substrate of the semiconductor device, and especially in the structure of a unit cell forming the memory, the upper electrode of the capacitor is directly connected to the high density diffusion layer which constitutes a part of the MOS transistor.

I claim:

1. A semiconductor device comprising:
   a transistor having a gate electrode over a substrate, and source and drain electrodes in said substrate;
   a ferroelectric capacitor located above said substrate and including a lower electrode, a dielectric including a ferroelectric material which is located over said lower electrode, and an upper electrode having first and second portions, said dielectric being located between said first portion and the substrate, said second portion extending to and being in direct contact with said source electrode.

2. A semiconductor device comprising:
   a transistor having a gate electrode located above a substrate, and source and drain electrodes located in the substrate, the transistor being associated with electrical insulation having a contact opening therein to said source electrode;
   a ferroelectric capacitor located above the substrate and having a lower electrode, a dielectric including a ferroelectric material which is located over said lower electrode, and an upper electrode having first and second portions, said dielectric being located between said first portion and said substrate, said second portion extending into said contact window for said source electrode; and
   a barrier metal disposed within said contact window between said upper electrode second portion and said source electrode.

3. The device according to claim 2 wherein said barrier metal is a compound selected from the group comprising TiON, MoSi, TiW, $RuO_2$ and $ReO_2$.

4. The device according to claim 1 wherein said ferroelectric material is comprised of an oxide compound including lead, zirconium, and titanium.

5. The device according to claim 2 wherein said ferroelectric material is comprised of an oxide compound including lead, zirconium, and titanium.

6. The device according to claim 1 wherein said upper and lower electrodes are comprised of platinum.

7. The device according to claim 2 wherein said upper and lower electrodes are comprised of platinum.

* * * * *